US 8,996,941 B2

(12) United States Patent
Lin et al.

(10) Patent No.: US 8,996,941 B2
(45) Date of Patent: Mar. 31, 2015

(54) TEST DATA VOLUME REDUCTION BASED ON TEST CUBE PROPERTIES

(71) Applicant: Mentor Graphics Corporation, Wilsonville, OR (US)

(72) Inventors: Xijiang Lin, West Linn, OR (US); Janusz Rajski, West Linn, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 30 days.

(21) Appl. No.: 13/914,529

(22) Filed: Jun. 10, 2013

(65) Prior Publication Data
US 2013/0332786 A1 Dec. 12, 2013

Related U.S. Application Data

(60) Provisional application No. 61/657,683, filed on Jun. 8, 2012.

(51) Int. Cl.
*G01R 31/28* (2006.01)
*G01R 31/3177* (2006.01)
*G01R 31/3185* (2006.01)

(52) U.S. Cl.
CPC .... *G01R 31/3177* (2013.01); *G01R 31/318544* (2013.01); *G01R 31/318547* (2013.01)
USPC ............................ 714/731; 714/727; 714/728

(58) Field of Classification Search
CPC ................. G01R 31/318544; G01R 31/3177; G01R 31/318547
USPC ................................................. 714/726–731
See application file for complete search history.

(56) References Cited

U.S. PATENT DOCUMENTS

| 6,782,501 | B2 * | 8/2004 | Distler et al. | 714/738 |
| 7,103,816 | B2 * | 9/2006 | Distler et al. | 714/738 |
| 7,734,973 | B2 * | 6/2010 | Hiraide et al. | 714/729 |
| 8,418,100 | B2 * | 4/2013 | Wang et al. | 716/106 |
| 8,499,209 | B2 * | 7/2013 | Rajski et al. | 714/741 |
| 2011/0022908 | A1 * | 1/2011 | Wang et al. | 714/726 |

OTHER PUBLICATIONS

Chandra, A.; Chakrabarty, K., "A unified approach to reduce SOC test data volume, scan power and testing time," Computer-Aided Design of Integrated Circuits and Systems, IEEE Transactions on , vol. 22, No. 3, pp. 352,363, Mar. 2003.*
Xijiang Lin; Rajski, J., "On Utilizing Test Cube Properties to Reduce Test Data Volume Further," Test Symposium (ATS), 2012 IEEE 21st Asian , vol., no., pp. 83,88, Nov. 19-22, 2012.*

(Continued)

*Primary Examiner* — Cynthia Britt

(57) ABSTRACT

Background scan cells are selected from scan cells in a circuit based on specified bit distribution information for a plurality of test cubes generated for testing the circuit. A main portion and a background portion are then determined for each test cube in the plurality of test cubes. The background portion corresponds to the background scan cells. Test cubes in the plurality of test cubes that have compatible main portions are merged into test cube groups. Each test cube group in the test cube groups comprises a main test cube and background test cubes. A main test cube, supplied by a tester or a decompressor, may be shifted into the scan chains. A background test cube may be shifted into background chains and be inserted into the main test cube in the scan chains based on control signals.

10 Claims, 8 Drawing Sheets

Flow chart
200

(56) References Cited

OTHER PUBLICATIONS

G. Mrugalski et al., "Compression Based on Deterministic Vector Clustering of Incompatible Test Cubes," in Proc. Intl. Test Conf., 2009, Paper 9.2.

A.R. Pandey and J.H. Patel, "Reconfiguration Technique for Reducing Test Time and Test Volume in Illinois Scan Architecture Based Designs," in Proc. VLSI Test Symp., 2002, pp. 9-15.

H. Tang, S.M. Reddy, I. Pomeranz, "On Reducing Test Data Volume and Test Application Time for Multiple Scan Chain Designs," in Proc. Intl. Test Conf., 2003, pp. 1079-1088.

S. Samaranayake et al., "A Reconfigurable Shared Scan-in Architecture," in Proc. VLSI Test Symp., 2003, pp. 9-14.

L.-T. Wang, "VirtualScan: A New Compressed Scan Technology for Test Cost Reduction," in Proc. Intl. Test Conf., 2004, pp. 916-925.

B. Keller et al., "OPMISR: The Foundation for Compressed ATPG Vector," in Proc. Intl. Test Conf., 2001, pp. 748-757.

P. Wohl et al., "Efficient Compression of Deterministic Patterns into Multiple PRPG Seeds," in Proc. Intl. Test Conf., 2005, paper 36.1.

S. Hellebrand et al., "Build-in Test for Circuits with Scan Based on Reseeding of Multiple-Polynomial Linear Feedback Shift Register," in IEEE Trans. Comp., vol. C-44, Feb. 1995, pp. 223-233.

C.V. Krishna and N. A. Touba, "Reducing Test Data Volumn Using LFSR Reseeding with Seed Compression," in Intl. Test Conf., 2003, pp. 321-330.

J. Rajski, J. Tyszer, M. Kassab, and N. Mukherjee, "Embedded Deterministic Test," in Trans. on CAD, vol. 23, May 2004, pp. 776-792.

\* cited by examiner

Flow chart
200

Background Chain
$\overbrace{s_1 \quad s_2 \quad s_3}$
$t_1$: 0X  1X  XX XX
$t_2$: X1  0X  1X XX X0
$t_3$: XX  XX  0X 1X 1X

(a) Initial SC vector set $m_1$: 01 XX XX XX X0
$btc_1$: { 110, 1X10XX }
$btc_2$: { 100, 0X1XXX }

(c) After merging with $t_2$ $m_1$: 0X XX XX XX XX
$btc_1$: { 110, 1XX0XX }
$\phantom{btc_1:\{\ }\underbrace{\phantom{110}}_{c}\ \underbrace{\phantom{1XX0XX}}_{s_1\ s_2\ s_3}$

(b) Background test cube derived from $t_1$ $m_1$: 01 XX XX XX 10
$btc_1$: { 110, 1X10XX }
$btc_2$: { 100, 0X1XXX }
$btc_3$: { 011, XX0X1X }

(d) After merging with $t_3$

TEST DATA VOLUME REDUCTION BASED ON TEST CUBE PROPERTIES

RELATED APPLICATIONS

This application claims priority to U.S. Provisional Patent Application No. 61/657,683, entitled "Reduction of Test Data Volume," filed on Jun. 8, 2012, and naming Xijiang Lin et al. as inventors, which application is incorporated entirely herein by reference.

FIELD OF THE INVENTION

The present invention relates to the field of circuit testing technology. Various implementations of the invention may be particularly useful for scan-based testing.

BACKGROUND OF THE INVENTION

As integrated circuit feature size continues to shrink, more functional blocks are integrated in a single chip. As such, circuit testing becomes more challenging. To minimize the number of defects undetected during manufacture testing, various test pattern sets for a wide range of fault models must be applied, thereby increasing test pattern counts significantly. The resultant high test data volume leads to high test costs. Reducing test data volume, therefore, has been an important area for circuit testing technology development.

On-chip test compression has become a standard design-for-test approach in industry today. The original idea of test data compression exploits the fact that the number of specified bits in test cubes is typically no more than 1% of total number of scan cells in the design. To achieve test compression, these specified bits are encoded as a LFSR (linear feedback shift register) seed. During a test, the encoded seed is decompressed by an on-chip LFSR and shifted into scan chains.

The encoding capacity can be improved by combining a linear finite-state machine (e.g., a ring generator) with a combinational linear decompressor (e.g., an XOR network). Compressed test stimuli, injected at both current and previous cycles, are utilized to encode the test stimulus needed at the current shift cycle. During a test, the compressed test stimuli are injected continuously while the decompressed test stimuli are shifted into scan chains. This dynamic reseeding approach enables a greater encoding capability than a static reseeding approach.

The encoding efficiency can be further improved through vector clustering. In this scheme, incompatible test cubes are merged to form a parent test cube and incremental test patterns along with a control pattern. During test data loading, the parent test pattern is combined with the incremental test patterns according to the control pattern to reconstruct the incompatible test cubes.

Still further test data volume reduction can be achieved and will be discussed below based on additional properties of test cubes.

BRIEF SUMMARY OF THE INVENTION

Various aspects of the present invention relate to techniques of reducing test data volume based on test cube properties. Background scan cells are selected from scan cells in a circuit based on specified bit distribution information for a plurality of test cubes generated for testing the circuit. A small percentage of the scan cells are usually specified by the majority of the test cubes. A scan cell is referred to as being specified by a test cube when the test cube has a specified bit for the scan cell. Some embodiments of the invention select a predetermined number of scan cells being specified for the largest numbers of times. Some other embodiments of the invention select scan cells that are specified for more than a predetermined number of times.

A main portion and a background portion are then determined for each test cube in the plurality of test cubes. The background portion corresponds to the background scan cells. The background portion may be divided into several segments. Each of the segments may include one or more scan cells.

Test cubes in the plurality of test cubes that have compatible main portions are merged into test cube groups. Each test cube group in the test cube groups comprises a main test cube and background test cubes. The main test cube is formed based on main portions of test cubes that are merged into the each test cube group. The background test cubes are formed based on background portions of the test cubes that are merged into the each test cube group. The background test cubes may comprise control information for specified bit locations.

A main test cube, supplied by a tester or a decompressor, may be shifted into the scan chains. A background test cube may be shifted into background chains and be transferred into the main test cube in the scan chains based on control signals. The background chains may be divided into segments, wherein each of the segments can be bypassed and/or disabled separately.

BRIEF DESCRIPTION OF THE DRAWINGS

FIG. 3 illustrates an example of applying the process described in FIG. 2 according to some embodiments of the invention.

DETAILED DESCRIPTION OF THE INVENTION

Various aspects of the present invention relate to techniques of reducing test data volume based on test cube properties. In the following description, numerous details are set forth for the purpose of explanation. However, one of ordinary skill in the art will realize that the invention may be practiced without the use of these specific details. In other instances, well-known features have not been described in details to avoid obscuring the present invention.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

The detailed description of a method or a device sometimes uses terms like "determine," "select" and "merge" to describe the disclosed method or the device function/structure. Such terms are high-level abstractions. The actual operations or functions/structures that correspond to these terms will vary depending on the particular implementation and are readily discernible by one of ordinary skill in the art. It should also be appreciated by one of ordinary skill in the art that the term "coupled" means "connected directly or indirectly."

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

Figure 1A:
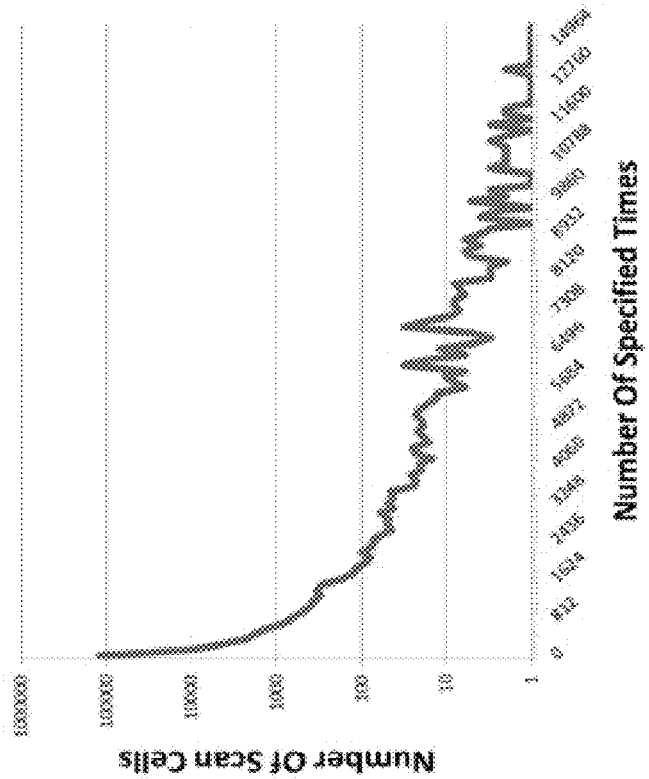
FIGS. 1A and 1B illustrate distributions of specified bits over scan cells for two test cube sets generated for testing a circuit, one for stuck-at faults (1A) and the other for transition faults (1B).
Figure 1B:
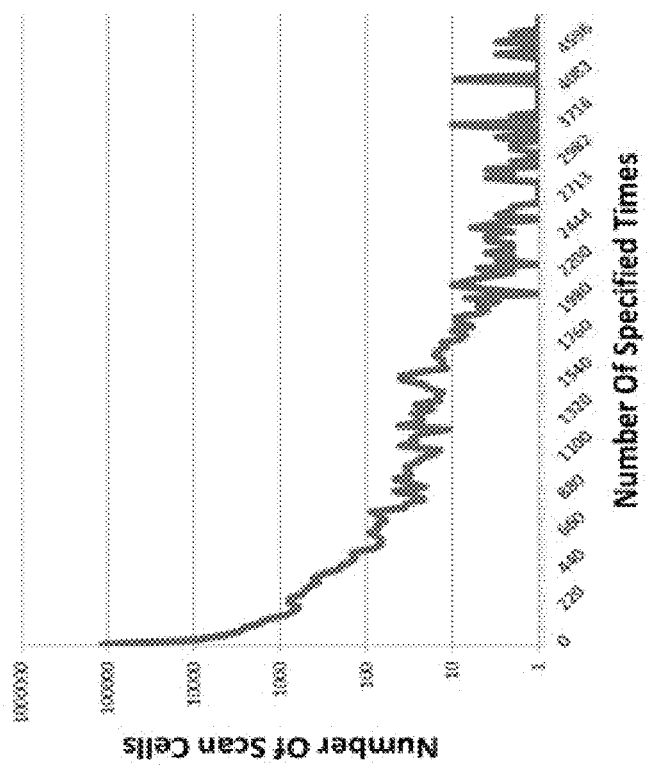

FIGS. 1A and 1B illustrate distributions of specified bits over scan cells for two test cube sets generated for testing a circuit, one for stuck-at faults (1A) and the other for transition faults (1B). The circuit is an industrial design having 2.5 million gates, 1200 scan chains (143,000 scan cells), and 24 embedded deterministic test channels. In each of the distribution graphs, the Y-axis denotes the number of scan cells that are specified the same number of times by the test cube set while the X-axis denotes the number of specified times. Here, a scan cell being specified by a test cube refers to the fact that the test cube has a specified bit for the scan cell.

As can be seen from FIGS. 1A and 1B, a small percentage of scan cells are specified by the majority of test cubes and the majority of scan cells are specified by only a few of test cubes. If two incompatible test cubes are randomly picked from a test cube set, they are incompatible usually due to contradictory bits for scan cells being specified most frequently. This along with the fact that each test cube has few specified bits can be utilized to reduce test data volume.

Figure 2:
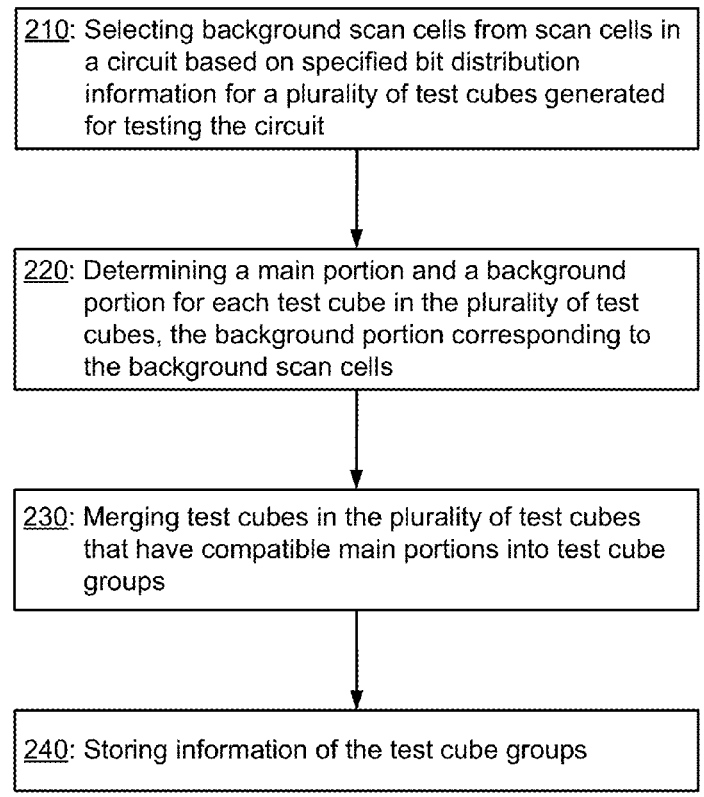
FIG. 2 illustrates a flow chart describing methods of reducing test data volume based on test cube properties that may be employed by various embodiments of the invention.

FIG. 2 illustrates a flow chart 200 describing methods of reducing test data volume based on test cube properties that may be employed by various embodiments of the invention. Initially, in operation 210, background scan cells are selected from scan cells in a circuit based on specified bit distribution information for a plurality of test cubes generated for testing the circuit. The specified bit distribution information may comprise information about how many times a scan cell is specified by the plurality of test cubes. Scan cells that are specified the largest numbers of times by the plurality of test cubes may be selected as background scan cells. Some embodiments of the invention select a predetermined number of scan cells being specified for the largest numbers of times. Some other embodiments of the invention select scan cells that are specified for more than a predetermined number of times. Other information such as the encoding capacity of test compression may also be considered for selection.

Next, in operation 220, a main portion and a background portion are determined for each test cube in the plurality of test cubes. The background portion corresponds to the background scan cells. The background portion may be divided into several segments. Each of the segments may include one or more scan cells.

Next, in operation 230, test cubes in the plurality of test cubes that have compatible main portions are merged into test cube groups. Each test cube group in the test cube groups comprises a main test cube and background test cubes. The main test cube is formed based on main portions of test cubes that are merged into the each test cube group. The background test cubes are formed based on background portions of the test cubes that are merged into the each test cube group. The background test cubes may comprise control information for specified bit locations.

In operation 240, the information of the test cube groups is stored in a processor-accessible medium.

FIG. 3 illustrates an example of applying the above process according to some embodiments of the invention. Part (a) of FIG. 3 shows three test cubes $t_1$-$t_3$. These three test cubes are divided into two portions: the first two and the last two bits belong to the main portion and the middle six bits belong to the background portion. The background portion is further divided into three segments, $s_1$-$s_3$, of which each has two bits. It should be noted that the figure is for illustration and the main portion, in reality, usually has much more bits than the background portion.

The main portions of test cubes $t_1$-$t_3$ are compatible and thus can be merged into a test cube group. Part (c) of FIG. 3 illustrates the intermediate result of merging test cubes $t_1$ and $t_2$. Part (d) of FIG. 3 illustrates the final result of merging all of the test cubes. The main test cube in the test cube group is labeled as "$m_1$," and the background test cubes in the test cube group are labeled as "$btc_j$," corresponding to the original test cubes j, j=1-3. In addition to the three segments $s_1$-$s_3$, each of the background test cubes also has a control segment labeled as "c" in part (b) of FIG. 3. The value of $c_j^i$ indicates whether the $i_{th}$ segment of the background test cube j should be combined into the main test cube to form the original test cube j.

Figure 7:
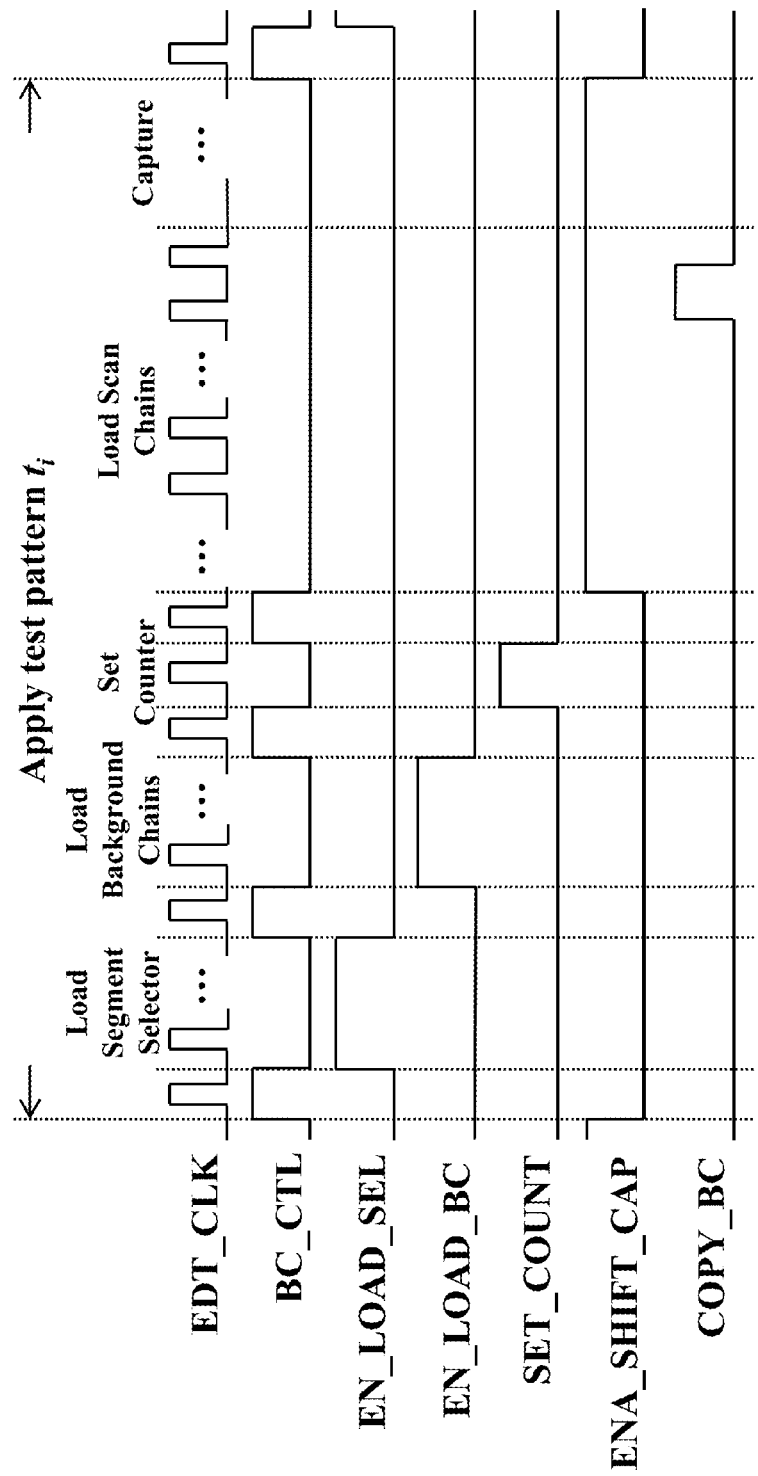
FIG. 7 illustrates signal waveforms for the background chain controller shown in FIG. 6(a).

In part (b) of FIG. 3, the $btc_1$ has two bits, $c_1^1$ and $c_1^2$, with a "1" value, corresponding to the $s_1$ and $s_2$ segments of the test cube $t_1$ that have specified bits. When $t_1$ and $t_2$ are merged, the second bit $c_2^2$ of $btc_2$ is set to 0 even though the $s_2$ segment of the test cube $t_2$ has a specified bit because the $s_2$ segments for the two are merged and $t_2$ is assumed to be applied right after $t_1$. The resultant $btc_2$ is shown in part (c) of FIG. 3. Similarly, the $btc_1$ after merging with $t_3$ is shown in FIG. 7(d). Note that $s_3$ in $btc_3$ is not merged to either $btc_1$ or $btc_2$ since both $c_1^3=0$ and $c_2^3=0$.

The following lists a detailed procedure for the merging process according to some embodiments of the invention:

Procedure 1: compress_SC_vector_set($M_{SC}$, N)
  //$M_{SC}$: the scan cell vector set created by deterministic test generator
  //N: the number of segments in the background chain
  1. Set the SC vector set, $P_{SC}$, to be empty.
  2. Mark every SC vector $t_i$ in $M_{SC}$ as uncompressed.
  3. For (i=1; i<=|$M_{SC}$|; i=i+1), do:
    (1) If $t_i$ is marked as compressed, go to Step 3.
    (2) Initialize the background test cube set $BTC_i$ to be empty. A background test cube btc={c, s} includes two components: an N-bit vector c to store the segment control data and a vector s including N-sub-vectors to store the assignments at the N-segments in the background chain. If the $k^{th}$ segment in s has at least one specified bit, the $k^{th}$ bit in c is assigned to 1. Otherwise, the bit is assigned to 0.
    (3) Create the SC vector $m_i$ from $t_i$ such that it includes all the specified bits except those in the background chain.

(4) Create $btc_i$ based on $t_i$ and add it to $BTC_i$.
(5) For (j=i+1; j<=|$M_{SC}$|; j=j+1), do:
  (a) If $t_j$ is either marked as compressed or incompatible with $m_i$, go to Step 3(5).
  (b) If all the specified bits in $t_1$ except those in the background chain can be compressed with $m_i$, merge them to $m_i$. Otherwise, go to Step 3(5).
  (c) Create $btc_j$ based on
  (d) For (k=1; k<=N; k=k+1), do:
    (i) If $c_j^k$ in $btc_j$ is 0, go to Step 3(5)(d).
    (ii) Find largest q, q∈{1, |$BTC_i$|}, such that $c_q^k$=1 and the $k^{th}$ segments of $btc_j$ is compatible with the $k^{th}$ segments of $btc_r$ for all r∈{q, |$BTC_i$|} and $c_s^k$=0 for all s∈{q+1, |$BTC_i$|}.
    (iii) If q is found, merge the $k^{th}$ segment of $btc_j$ to the $k^{th}$ segment of $btc_q$ and set $c_j^k$=0. The specified bits in the $k^{th}$ segment of $btc_j$ is not reset to unspecified in order to use them to check the contradictory bits in Step 3(5)(d)(ii).
  (e) If at least one bit in $c_j$ is 1, append $btc_j$ to the end of $BTC_i$.
  (f) Mark $t_j$ as compressed.
(6) For every $btc_j$, j∈{1, |$BTC_i$|}, reset all the bits in the $k^{th}$ segment of $btc_j$ to be unspecified if $c_j^k$=0.
(7) If at least one $t_j$ is compressed with $t_i$ in Step 3(5), add {$m_i$, $BTC_i$} to $P_{SC}$. Otherwise, add {$t_i$, φ} to $P_{SC}$.
4. Return the compressed SC vector set $P_{SC}$.

When applying the $i^{th}$ entry {$m_i$, $BTC_i$} in $P_{SC}$ during test, if |$BTC_i$|=0, $m_i$ contains the complete test stimulus data. The test is applied by loading $m_i$ to the main scan chains following capture; if |$BTC_i$|>0, following steps are repeated |$BTC_i$| times: 1) load $c_j$ of the $j^{th}$ background test cube $btc_j$ in $BTC_i$ to the segment control; 2) load the activated segment data in $btc_j$, i.e., the segments with bit in $c_j$ set to 1, to the background chain; and 3) load $m_i$ to the main scan chain and transfer the data from the background chain to the main scan chains at last shift and apply capture next.

Figure 4:
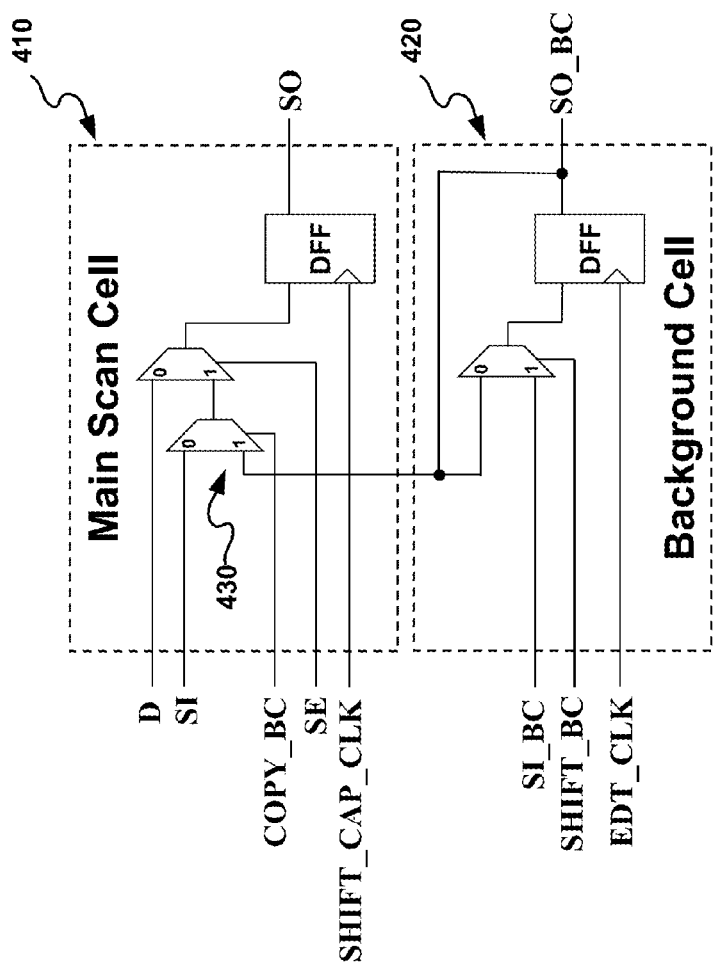
FIG. 4 illustrates a design of a background scan cell that may be employed by various embodiments of the invention.

To apply test data compressed using the disclosed approach, conventional scan cells need to be modified to serve as background scan cells. FIG. 4 illustrates a design of a background scan cell that may be employed by various embodiments of the invention. This background scan cell includes two components, a main scan cell 410 for storing the main test cube and a background cell 420 for storing the background test cube. The main scan cell is essentially a traditional scan cell with an additional multiplexer 430. When loading data to the background cell 420, SHIFT_CAP_CLK is disabled to make the main scan cell hold its state, SHIFT_BC is set to be 1, and EDT_CLK is pulsed to shift data into the background cell. During other operations, SHIFT_BC is 0 to make the background cell hold its value. To load the main test cube into the main scan cell 420, SE is set to 1 and COPY_BC stays at 0 except the last shift cycle. Right before the last shift cycle, COPY_BC is set to 1 and the data stored in the background cell 420 is transferred to the main scan cell 410.

Figure 5:
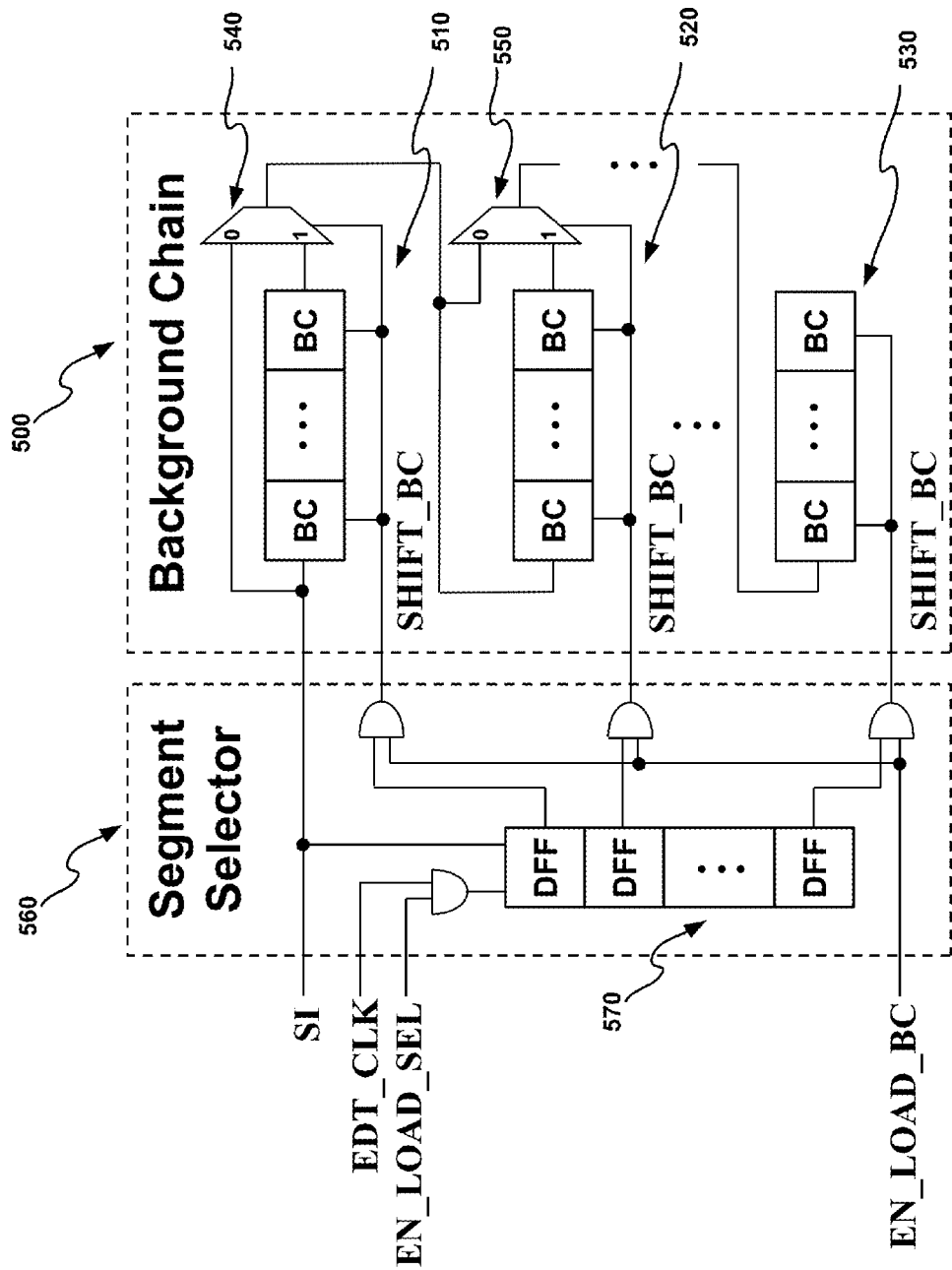
FIG. 5 illustrates a design of a background chain and a segment selector that may be employed by various embodiments of the invention.

FIG. 5 illustrates a design of a background chain 500 and a segment selector 560 that may be employed by various embodiments of the invention. The background chain 500 is formed by stitching background cell components (labeled as "BC" in the figure) of the background scan cells together. They are divided into multiple segments such as 510, 520 and 530 shown in the figure. The multiplexers such as 540 and 550 inserted between two neighborhood segments are used to bypass one or more segments during loading the background chain in order to reduce test data volume. The segment selector 560 comprises a shift register 570 and each flip-flop (labeled as "DFF") in it is dedicated to control a unique segment in the background chain 500.

During a test, the segment selector 560 may be loaded first by setting EN_LOAD_SEL=1 and the background chain 500 may be loaded next by setting EN_LOAD_BC=1. If a flip-flop in the segment selector 560 is loaded with 1, the background chain segment controlled by this flip-flop will receive shifted-in data from SI. Otherwise, it is bypassed and will hold its content during shift. The pin SI can be shared with an embedded-deterministic-test channel input. The architecture given in FIG. 5 can be easily extended to support multiple background chains.

Figure 6:
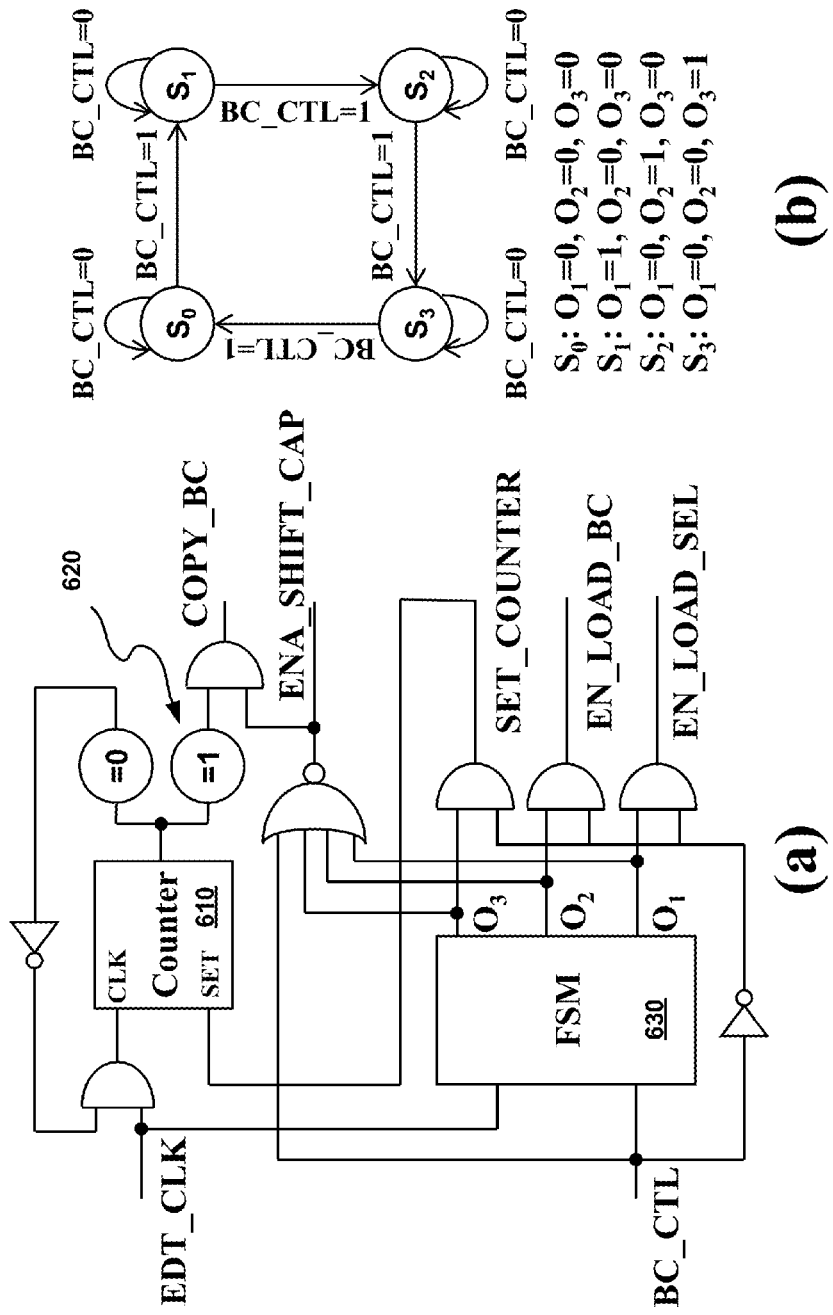
FIG. 6(a) illustrates a design of a background chain controller that may be employed by various embodiments of the invention.
FIG. 6(b) illustrates outputs of the finite state machine (FSM) 630 in FIG. 6(a) at different states.

FIG. 6(a) illustrates a design of a background chain controller that may be employed by various embodiments of the invention. The background chain controller has one new input BC_CTL and generates control signals to load both the scan chains and the background chains. The counter 610 starts by counting down from a value equal to the number of shift cycles used to load the scan chains once it is set by SET_COUNTER=1. The equal-1 detector 620 outputs a "1" when the counter 610 reaches to 1. This signal allows transferring the data from the background chains to the scan chains at the last cycle to shift the scan chains. When the counter 610 reaches to 0, it stays at 0 till SET_COUNTER becomes 1 again. The finite state machine (FSM) 630 includes four states and its state transition diagram is given in FIG. 6(b). The FSM 630 starts from the state $S_0$ when applying next test pattern. The control input BC_CTL=1 drives the FSM 630 to a new state after pulsing EDT_CLK. The outputs of the FSM 630 at different states are shown in FIG. 6(b). The operations at each state are summarized as follows and the signal waveforms are given in FIG. 7:

$S_0$: ENA_SHIFT_CAP is asserted when BC_CTL=0. The main test cube generated from decompressor is loaded to the scan chains. Optionally, the data in the background chains are transferred to the main scan chains at last shift.
  $S_1$: ENA_LOAD_SEL is asserted after BC_CTL becomes 0. The segment selector 560 loads the scan data from SI. If BC_CTL holds at 1, the operation of loading the segment selector 560 will be skipped.
  $S_2$: ENA_LOAD_BC is asserted after BC_CTL becomes 0. The background test cube is loaded to the background chains from SI. If BC_CTL holds at 1, the operation of loading the background chain will be skipped.
  $S_3$: SET_COUNTER is asserted after BC_CTL becomes 0. The counter 610 is set to the value equal to the number of cycles to shift the main scan chains. If BC_CTL holds at 1, the operation of setting the counter 610 will be skipped and no data is transferred from the background chains to the main scan chains at the last cycle to shift the main scan chains.

When the FSM 630 is at the states other than $S_0$, the main scan cells cannot be disturbed. ENA_SHIFT_CAP can be used to gate off the clocks driving the main scan cells. If the data in the background chains are not needed, holding BC_CTL at 0 will bypass the background chains during applying a test pattern.

Figure 8:
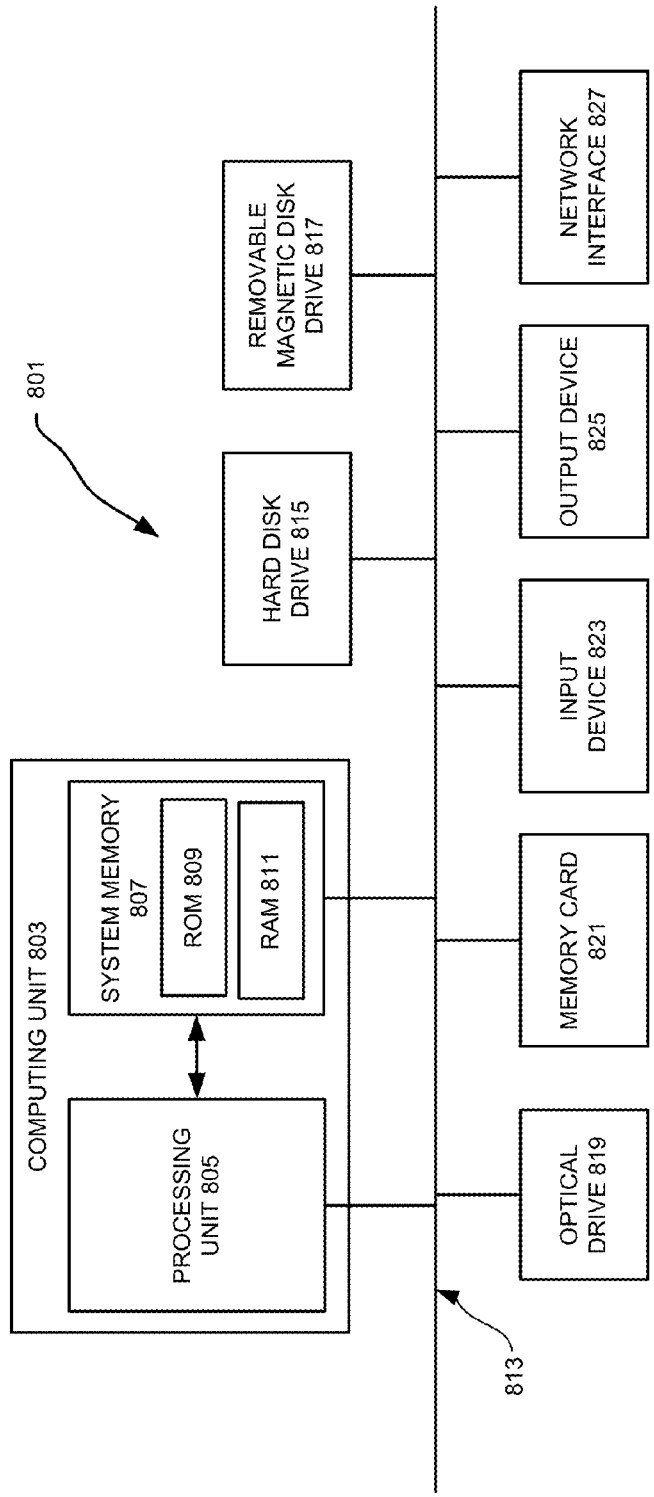
FIG. 8 shows an illustrative example of such a programmable computer.

Various embodiments of the invention may be implemented through the execution of software instructions by a computing device, such as a programmable computer. FIG. 8 shows an illustrative example of such a programmable computer (a computing device 801). As seen in this figure, the computing device 801 includes a computing unit 803 with a processing unit 805 and a system memory 807. The processing unit 805 may be any type of programmable electronic device for executing software instructions, but will conventionally be a microprocessor. The system memory 807 may include both a read-only memory (ROM) 809 and a random access memory (RAM) 811. As will be appreciated by those of ordinary skill in the art, both the read-only memory (ROM) 809 and the random access memory (RAM) 811 may store software instructions for execution by the processing unit 805.

The processing unit 805 and the system memory 807 are connected, either directly or indirectly, through a bus 813 or alternate communication structure, to one or more peripheral devices. For example, the processing unit 805 or the system memory 807 may be directly or indirectly connected to one or more additional memory storage devices, such as a "hard" magnetic disk drive 815, a removable magnetic disk drive 817, an optical disk drive 819, or a flash memory card 821. The processing unit 805 and the system memory 807 also may be directly or indirectly connected to one or more input devices 823 and one or more output devices 825. The input devices 823 may include, for example, a keyboard, a pointing device (such as a mouse, touchpad, stylus, trackball, or joystick), a scanner, a camera, and a microphone. The output devices 825 may include, for example, a monitor display, a printer and speakers. With various examples of the computer 801, one or more of the peripheral devices 815-825 may be internally housed with the computing unit 803. Alternately, one or more of the peripheral devices 815-825 may be external to the housing for the computing unit 803 and connected to the bus 813 through, for example, a Universal Serial Bus (USB) connection.

With some implementations, the computing unit 803 may be directly or indirectly connected to one or more network interfaces 827 for communicating with other devices making up a network. The network interface 827 translates data and control signals from the computing unit 803 into network messages according to one or more communication protocols, such as the transmission control protocol (TCP) and the Internet protocol (IP). Also, the interface 827 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 801 is illustrated as an example only, and it not intended to be limiting. Various embodiments of the invention may be implemented using one or more computing devices that include the components of the computer 801 illustrated in FIG. 8, which include only a subset of the components illustrated in FIG. 8, or which include an alternate combination of components, including components that are not shown in FIG. 8. For example, various embodiments of the invention may be implemented using a multi-processor computer, a plurality of single and/or multiprocessor computers arranged into a network, or some combination of both.

Some other embodiments of the invention may be implemented by software instructions, stored on a non-transitory computer-readable medium, for instructing one or more programmable computers/computer systems to perform operations such as those shown in the flow chart 400 in FIG. 4. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device.

Conclusion

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. A method, executed by at least one processor of a computer, comprising:
    selecting background scan cells from scan cells in a circuit based on specified bit distribution information for a plurality of test cubes generated for testing the circuit;
    determining a main portion and a background portion for each test cube in the plurality of test cubes, the background portion corresponding to the background scan cells;
    merging test cubes in the plurality of test cubes that have compatible main portions into test cube groups, each test cube group in the test cube groups comprising a main test cube formed based on main portions of test cubes that are merged into the each test cube group and background test cubes formed based on background portions of the test cubes that are merged into the each test cube group; and
    storing information of the test cube groups.

2. The method recited in claim 1, wherein each of the background scan cells are scan cells being specified for more than a predetermined number of times by the plurality of test cubes.

3. The method recited in claim 1, wherein the selecting background scan cells comprises:
    determining a predetermined number of scan cells that are specified for the largest numbers of times by the plurality of test cubes.

4. The method recited in claim 1, wherein the background portion is divided into segments.

5. The method recited in claim 1, wherein the background test cubes comprise control information for specified bit locations.

6. One or more non-transitory computer-readable media storing computer-executable instructions for causing one or more processors to perform a method, the method comprising:
    selecting background scan cells from scan cells in a circuit based on specified bit distribution information for a plurality of test cubes generated for testing the circuit;
    determining a main portion and a background portion for each test cube in the plurality of test cubes, the background portion corresponding to the background scan cells;
    merging test cubes in the plurality of test cubes that have compatible main portions into test cube groups, each test cube group in the test cube groups comprising a main test cube formed based on main portions of test cubes that are merged into the each test cube group and background test cubes formed based on background portions of the test cubes that are merged into the each test cube group; and
    storing information of the test cube groups.

7. The one or more non-transitory computer-readable media recited in claim 6, wherein each of the background scan cells are scan cells being specified for more than a predetermined number of times by the plurality of test cubes.

8. The one or more non-transitory computer-readable media recited in claim 6, wherein the selecting background scan cells comprises:
   determining a predetermined number of scan cells that are specified for the largest numbers of times by the plurality of test cubes.

9. The one or more non-transitory computer-readable media recited in claim 6, wherein the background portion is divided into segments.

10. The one or more non-transitory computer-readable media recited in claim 6, wherein the background test cubes comprise control information for specified bit locations.

* * * * *